United States Patent
Wang

(10) Patent No.: US 9,685,220 B2
(45) Date of Patent: Jun. 20, 2017

(54) DDR CONTROLLER, METHOD FOR IMPLEMENTING THE SAME, AND CHIP

(75) Inventor: Hongbin Wang, Guangdong (CN)

(73) Assignee: ARTEK Microelectronics Co., Ltd. (CN)

( * ) Notice: Subject to any disclaimer, the term of this patent is extended or adjusted under 35 U.S.C. 154(b) by 911 days.

(21) Appl. No.: 13/977,393

(22) PCT Filed: Jul. 25, 2011

(86) PCT No.: PCT/CN2011/077540
§ 371 (c)(1),
(2), (4) Date: Jun. 28, 2013

(87) PCT Pub. No.: WO2012/088879
PCT Pub. Date: Jul. 5, 2012

(65) Prior Publication Data
US 2013/0290621 A1 Oct. 31, 2013

(30) Foreign Application Priority Data
Dec. 29, 2010 (CN) .......................... 2010 1 0612846

(51) Int. Cl.
G11C 11/00 (2006.01)
G11C 11/406 (2006.01)
G11C 8/18 (2006.01)
G06F 13/16 (2006.01)

(52) U.S. Cl.
CPC .... *G11C 11/40618* (2013.01); *G06F 13/1631* (2013.01); *G11C 8/18* (2013.01)

(58) Field of Classification Search
None
See application file for complete search history.

(56) References Cited

U.S. PATENT DOCUMENTS 6,615,326 B1 * 9/2003 Lin .................... G06F 13/1647
711/154
2002/0174292 A1 11/2002 Morita et al.
2003/0018828 A1 * 1/2003 Craddock ............ G06F 13/385
719/321

FOREIGN PATENT DOCUMENTS

| CN | 1815625 A | 8/2006 |
|---|---|---|
| CN | 101078979 A | 11/2007 |
| CN | 101231879 A | 7/2008 |

\* cited by examiner

*Primary Examiner* — David X Yi
*Assistant Examiner* — Craig Goldschmidt
(74) *Attorney, Agent, or Firm* — DLA Piper LLP (US)

(57) ABSTRACT

There are provided a DDR controller, a method for implementing the same and a chip, which are applicable to the field of DDR controller technology. The method includes the steps of: parsing a plurality of buffered commands concurrently (S501); prejudging relationships between a bank and a row of an address to be accessed by each parsed command and a bank and a row of an address for a currently executed command; and transmitting a PRECHARGE command and an ACTIVE command in advance. With the above technical solution, the PRECHARGE command and ACTIVE command which should have been transmitted serially can be transmitted in advance by being hidden in parallel in a Read or WRITE period to thereby make full use of a bandwidth of a DDR device.

9 Claims, 5 Drawing Sheets

DDR CONTROLLER, METHOD FOR IMPLEMENTING THE SAME, AND CHIP

The present application is a U.S. National Stage of International Application No. PCT/CN2011/077540, filed 25 Jul. 2011, designating the United States, and claiming priority to Chinese Patent Application No. 201010612846.2 filed Dec. 29, 2010.

FIELD OF THE INVENTION

The present invention relates to the field of a Double Data Rate Synchronous Dynamic Random Access Memory (DDR SDRAM) controller and particularly to a DDR controller, a method for implementing the same and a chip.

BACKGROUND OF THE INVENTION

The present invention relates to the field of a Double Data Rate Synchronous Dynamic Random Access Memory (DDR SDRAM) controller and particularly to a DDR controller, a method for implementing the same and a chip.

A design of a DDR SDRAM controller (simply referred to as a "DDR controller" in the document of this application) shall support the most essential and common commands of a DDR device, including ACTIVE (ACTIVE command), READ (READ command), WRITE (WRITE command) and PRECHARGE (PRECHARGE command), where ACTIVE and PRECHARGE incur an extra bandwidth consumption as a crucial factor influencing the bandwidth of the DDR device. Reference is made to FIG. 1 illustrating a general DDR transmission timing diagram. A storage unit internal to the DDR device is a matrix unit composed of Banks (blocks), rows and columns, and thus in order to access a storage cell selected by a row and a column in a bank, firstly an ACTIVE command is transmitted to activate the bank and the row, and then a READ/WRITE command is transmitted along with the column to be accessed, and the DDR transmits corresponding data onto a DQ (data line) port only after corresponding time parameters are satisfied. If there is a further second READ/WRITE command following the first READ/WRITE command, then the DDR controller may perform a process in the following three scenarios dependent upon a different bank and row to be accessed by the command:

(1) The second command accesses the same bank and row as the first command, and then the READ/WRITE command can be transmitted directly, as illustrated in FIG. 2.

(2) The second command accesses a bank same as that accessed by the first command and a row different from that accessed by the first command, then the row accessed by the first command is firstly disabled by a PRECHARGE command, then the row accessed by the second command is activated by an ACTIVE command, and finally the READ/WRITE command can be transmitted, as illustrated in FIG. 3.

(3) The second command accesses a different bank and a row from the first command, then firstly the bank and the row accessed by the second command is activated by an ACTIVE command, and then the READ/WRITE command is transmitted. A difference from the scenario in FIG. 2 lies in the absence of a PRECHARGE command, as illustrated in FIG. 4.

As can be apparent from the second and third scenarios, the data on DQ is no longer consecutive due to the insertion of the extra PRECHARGE and ACTIVE commands, thus resulting in a bandwidth waste. The DDR controller is typically designed to perform commands serially, that is, to parse a succeeding command only after a preceding command is completed, thus resulting in a bandwidth waste.

SUMMARY OF THE INVENTION

An embodiment of the invention is to provide a method for implementing a DDR controller so as to solve the problem in the prior art of a bandwidth waste arising from the insertion of a PRECHARGE command and an ACTIVE command.

According to an embodiment of the invention, a method for implementing a DDR controller includes the steps of:

parsing a plurality of buffered commands concurrently; and prejudging relationships between a bank and a row of an address to be accessed by each parsed command and a bank and a row of an address for a currently executed command, and transmitting a PRECHARGE command and an ACTIVE command in advance.

An embodiment of the invention further provides a DDR controller including:

a command parsing unit configured to parse a plurality of buffered commands concurrently; and a command transmitting unit configured to prejudge relationships between a bank and a row of an address to be accessed by each parsed command and a bank and a row of an address for a currently executed command, and to transmit a PRECHARGE command and an ACTIVE command in advance.

An embodiment of the invention further provides a chip including the foregoing DDR controller.

The embodiments of the invention parse a plurality of buffered commands concurrently, prejudge relationships between a bank and a row of an address to be accessed by each parsed command and a bank and a row of an address for a currently executed command and transmit a PRECHARGE command and an ACTIVE command in advance so that the PRECHARGE command and the ACTIVE command which should have been transmitted serially can be transmitted in advance by being hidden in parallel in a Read or WRITE period to thereby make full use of a bandwidth of a DDR device.

DETAILED DESCRIPTION OF THE EMBODIMENTS

First Embodiment

During the use of a DDR device, a PRECHARGE command and an ACTIVE command have to be transmitted, thus resulting in a bandwidth waste despite a simplified design of a DDR controller with serial transmission of the commands. However as can be found, it will be sufficient if corresponding time parameters are satisfied in transmission of the commands, so a significant extra time overhead can be lowered for the purpose of improving a data throughput if potential PRECHARGE and ACTIVE commands of a second command are hidden in tRCD or a read or write data period of a first command.

Figure 1:
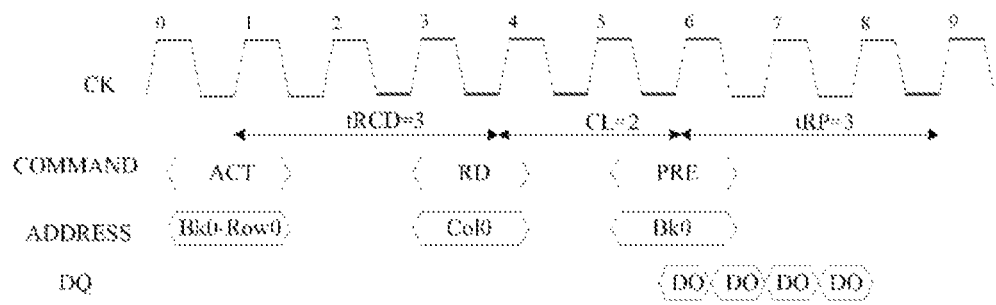
FIG. 1 is a DDR transmission timing diagram in the prior art.
Figure 2:
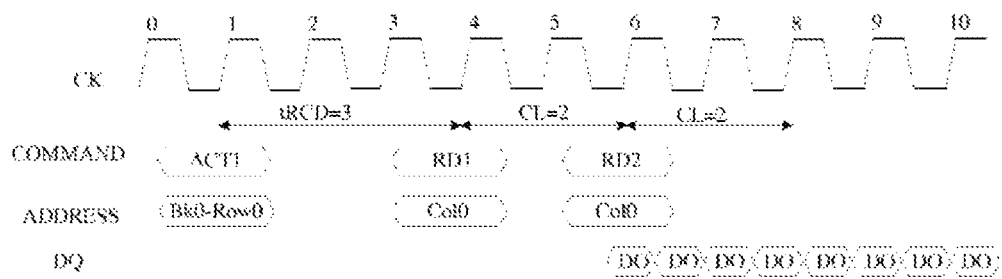
FIG. 2 is a DDR transmission timing diagram with the same bank and row in the prior art.
Figure 3:
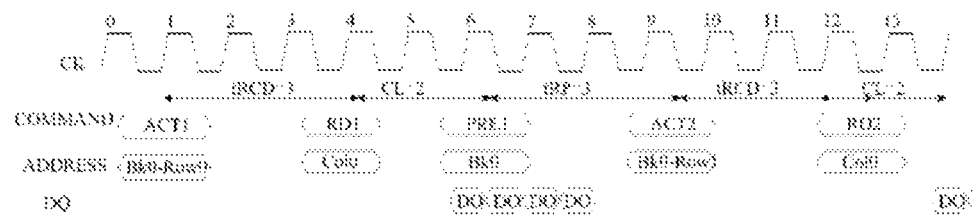
FIG. 3 is a DDR transmission timing diagram with the same bank and different rows in the prior art.
Figure 4:
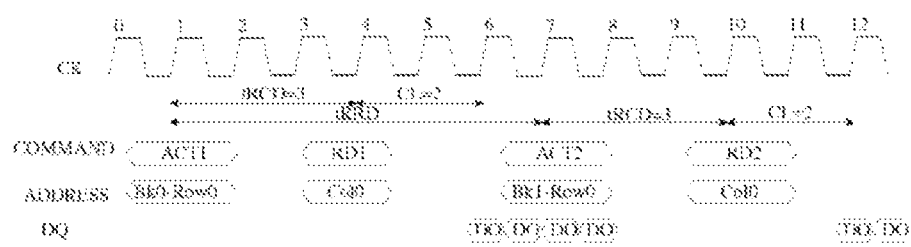
FIG. 4 is a DDR transmission timing diagram with different banks in the prior art.
Figure 5:
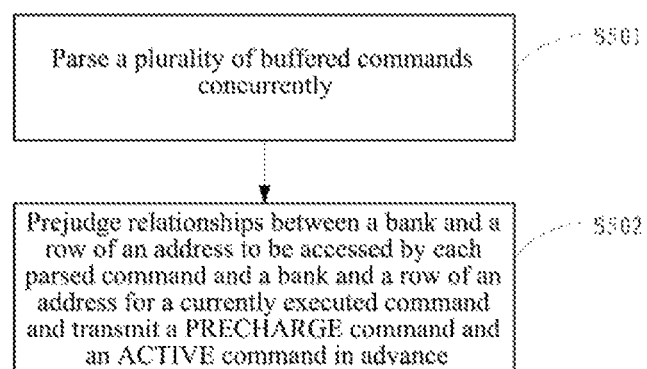
FIG. 5 is a flow chart of a method for implementing a DDR controller according to a first embodiment of the invention.

FIG. 5 is a flow chart of a method for implementing a DDR controller according to a first embodiment of the invention, will be detailed as follows:

The step S501 is to parse a plurality of buffered commands concurrently.

In an embodiment of the invention, a DDR device may receive a plurality of commands from a plurality of devices, so the DDR device will buffer the plurality of commands and parse the plurality of buffered commands concurrently.

In an embodiment of the invention, the number of concurrently parsed commands is determined by the number of banks of the DDR device and the number of hosts accessing the DDR device in a system application, for example, the number of concurrently parsed commands can be 3, 4 or 8.

The step S502 is to prejudge relationships between a bank and a row of an address to be accessed by each parsed command and a bank and a row of an address for a currently executed command, and to transmit a PRECHARGE command and an ACTIVE command in advance.

In an embodiment of the invention, while the PRECHARGE command and the ACTIVE command are transmitted in advance, the PRECHARGE command and the ACTIVE command transmitted in advance shall also satisfy a time requirement of the DDR device, for example, parameters of tRP (an interval of time between PRECHARGE and ACTIVE), tRRD (an interval of time between two ACTIVEs), tRCD (an interval of time between ACTIVE and a read or write command), etc.

In an embodiment of the invention, the PRECHARGE command and the ACTIVE command are transmitted in advance in view of a relationship between the bank and the row of the address to be accessed by each parsed command and the relationships between the bank and the row of the address to be accessed by each command and the bank and the row of the address for the currently executed command.

The method according to an embodiment of the invention can also be applicable to DDR2 SDRAM, DDR3 SDRAM, SDR SDRAM or other devices.

The embodiments of the invention parse a plurality of buffered commands concurrently, prejudge relationships between a bank and a row of an address to be accessed by each parsed command and a bank and a row of an address for a currently executed command, and transmit a PRECHARGE command and an ACTIVE command in advance so that the PRECHARGE command and the ACTIVE command which should have been transmitted serially can be transmitted in advance by being hidden in parallel in a READ or WRITE cycle to thereby make full use of a bandwidth of the DDR device.

Second Embodiment

In an embodiment of the invention, a PRECHARGE command and an ACTIVE command are transmitted in advance particularly under the following conditions:

(1) An ACTIVE command is transmitted in advance under the following condition:

A bank and a row to be accessed by a first command have not been activated; or

A bank and a row to be accessed by a succeeding command are different from a bank and a row to be accessed by any and all commands before the succeeding command;

(2) A PRECHARGE command is transmitted in advance under the following condition:

A succeeding command is to access a bank same as that to be accessed by a first command and a row different from that to be accessed by a first command, and to access the bank different from that to be accessed by a preceding command other than the first command, and then a PRECHARGE command will be transmitted after the first read/write command is completed.

For the sake of convenient understanding, the conditions under which a PRECHARGE command and an ACTIVE command are transmitted in advance will be described below respectively by way of examples in which the DDR controller parses three commands and four commands concurrently, but the invention will not be limited thereto.

When the DDR controller parses three commands concurrently, the three parsed commands are a first command, a second command and a third command sequentially.

An ACTIVE command is transmitted in advance particularly under the following condition:

(1) A bank and a row of the first command have not been activated; or (2) A bank and a row to be accessed by the second command are different from a bank and a row to be accessed by the first command; or (3) A bank and a row to be accessed by the third command are different from those to be accessed by both the first command and the second command.

A PRECHARGE command is transmitted in advance particularly under the following condition:

(1) The second command is to access a bank same as that to be accessed by the first command and a row different from that to be accessed by the first command, and a PRECHARGE command will be transmitted after the first command is completed; or (2) The third command is to access a bank same as that to be accessed by the first command and a row different from that to be accessed by the first command, and to access the bank different from that to be accessed by the second command, and a PRECHARGE command will be transmitted after the first command is completed; or When the DDR controller parses four commands concurrently, the four parsed commands are a first command, a second command, a third command and a fourth command sequentially.

An ACTIVE command is transmitted in advance particularly under the following condition:

(1) A bank and a row of the first command have not been activated; or (2) A bank and a row to be accessed by the second command are different from those to be accessed by the first command; or (3) A bank and a row to be accessed by the third command are different from those to be accessed by both the first command and the second command; or (4) A bank and a row to be accessed by the fourth command are different from those to be accessed by all the first command, second command and third command.

A PRECHARGE command is transmitted in advance particularly under the following condition:

(1) The second command is to access a bank same as that to be accessed by the first command and a row different from that to be accessed by the first command, and a PRECHARGE command will be transmitted after the first command is completed; or (2) The third command is to access a bank same as that to be accessed by the first command and a row different from that to be accessed by the first command, and to access the bank different from that to be accessed by the second command, and a PRECHARGE command will be transmitted after the first command is completed; or (3) The fourth command is to access a bank same as that to be accessed by the first command and a row different from that to be accessed by the first command, and to access the bank different from banks to be accessed by the second command and the third command, and then a PRECHARGE command will be transmitted after the first read/write command is completed.

In order to describe an effect of the invention, an effect of an embodiment of the invention will be described below by way of an example in which three commands are parsed concurrently. It is assumed that the DDR controller can pre-parse three commands and hide potential PRECHARGE and ACTIVE commands in a currently executed command for an improved bandwidth. Addresses to be accessed by the three commands parsed concurrently by the DDR controller and an order thereof are assumed respectively as follows:

A first command: Bank0 and Row0
A second command: Bank1 and Row0
A third command: Bank0 and Row1

Figure 6:
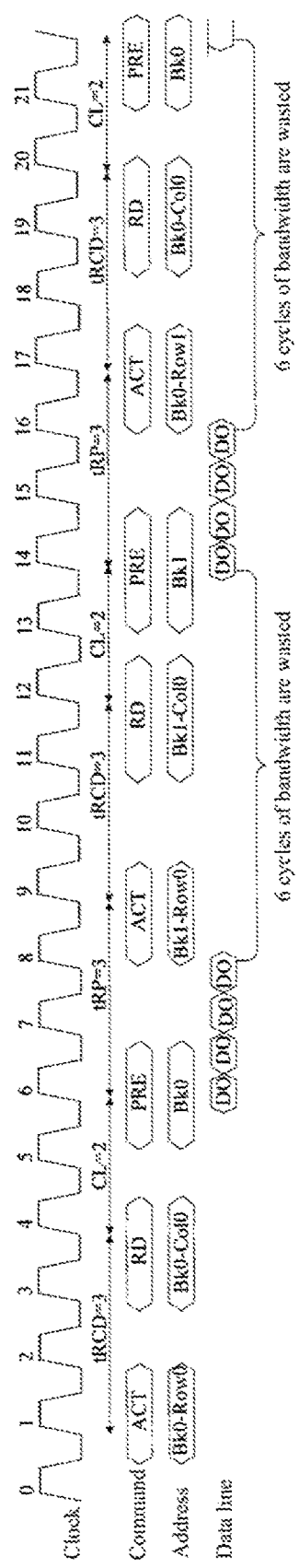
FIG. 6 is a timing diagram of serial transmission of a PRECHARGE command and an ACTIVE command according to a second embodiment of the invention.

Then reference is made to FIG. 6 illustrating a timing diagram of serial transmission of a PRECHARGE command and an ACTIVE command in the prior art, and as can be apparent from the figure, it takes 24 cycles to transition from the transmission of a first ACTIVE command to the reception of the last piece of data of a third read command, and there are up to 12 cycles of inconsecutive intervals of time for DQ, that is, the 12 cycles are wasted.

Figure 7:
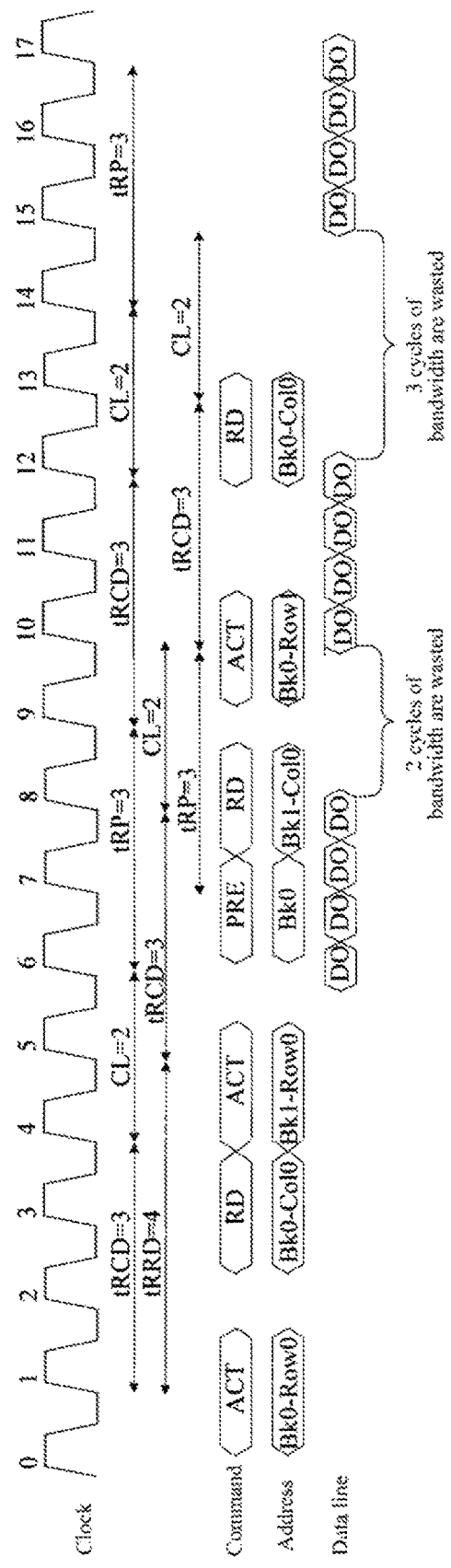
FIG. 7 is a timing diagram of parallel transmission in advance of a PRECHARGE command and an ACTIVE command according to the second embodiment of the invention.

In the method according to an embodiment of the invention, Bank1 and Row0 to be accessed by the second command are different from Bank0 and Row0 to be accessed by the first command, so the condition that an ACTIVE command can be transmitted in advance is satisfied; and furthermore Bank0 and Row1 to be accessed by the third command are the same bank as and a different row from Bank0 and Row0 to be accessed by the first command, and the third command is to access a different bank from Bank0 to be accessed by the second command, so a PRECHARGE command can be transmitted in advance. The ACTIVE command and the PRECHARGE command transmitted in advance shall also satisfy time periods of tRRD=4, tRCD=3 and tRP=3 of a DDR device, and particular reference to FIG. 7, as can be apparent from the figure, it takes 17 cycles to transition from the transmission of the first ACTIVE command to the reception of the last piece of data of the third read command, and there are up to 5 cycles of inconsecutive intervals of time for DQ, that is, only the 5 cycles are wasted, thus resulting in a bandwidth improvement by 29%.

In the embodiments of the invention, the utilization ratio of a bandwidth can be improved effectively by transmitting a PRECHARGE command and an ACTIVE command in advance.

In the embodiments of the invention, the larger the number of prejudged command, and the more complex the design of the controller is, the higher the bandwidth improvement will be.

Third Embodiment

In an embodiment of the invention, a state machine can prejudge relationships between a bank and a row of an address to be accessed by each parsed command and a bank and a row of an address for a currently executed command, and transmit PRECHARGE and ACTIVE in advance.

Figure 8:
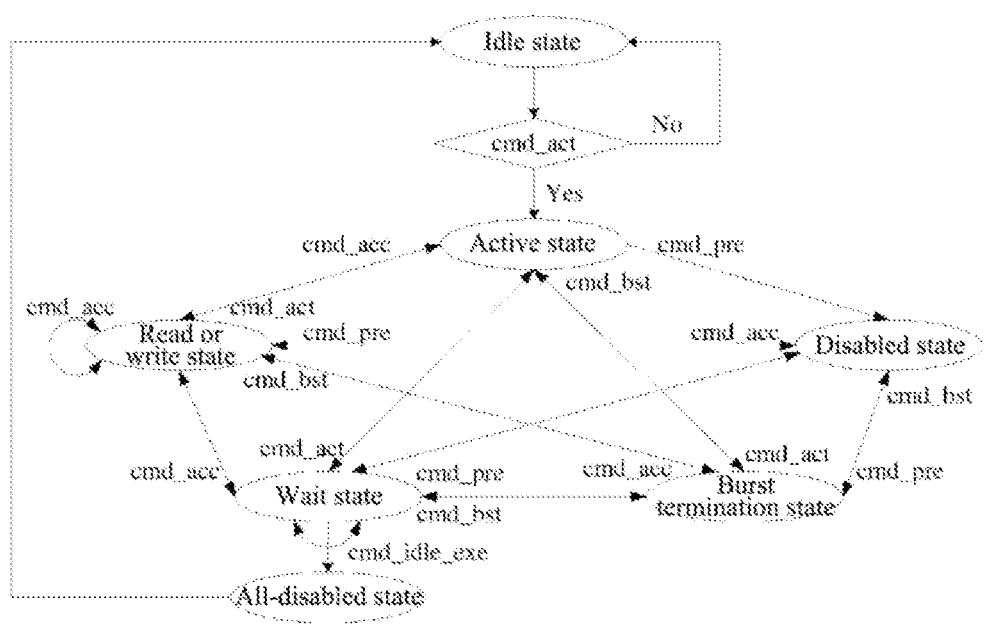
FIG. 8 is a schematic diagram of a state transition diagram of a state transition machine according to a third embodiment of the invention.

In an embodiment of the invention, particular reference can be made to FIG. 8 for states and state transition conditions of the state machine, where the states of the state machine include:

An idle state (CMD_IDLE): there is no action but waiting for a command in this state.

An active state (CMD_ACT): an ACTIVE command will be transmitted in this state.

A read/write state (CMD_ACC): a READ/WRITE command will be transmitted in this state.

A disabled state (CMD_PRE): a PRECHARGE command will be transmitted in this state.

A burst termination state (CMD_BST): a BURST_TERMINATE command will be transmitted if there is a read operation in this state.

A wait state (CMD_ACC_TM): A transition is made to the wait state when an interval of time between a command to be executed and a previously transmitted command does not satisfy a time parameter of the DDR device.

An all-disabled state (CMD_PRE_ALL): a PRECHARGE_ALL command is transmitted in this state to ensure that all banks of the DDR device are disabled after all commands are executed.

The transition conditions of the state machine particularly include:

1. cmd_act: a condition for transitioning to CMD_ACT is particularly as follows:

(1) A bank and a row to be accessed by a command have not been activated; or (2) A bank and a row to be accessed by a succeeding command are different from a bank and a row to be accessed by any and all commands before the command.

In an embodiment of the invention, a plurality of commands are parsed concurrently, so relationships between the bank and the row to be accessed subsequently and a bank and a row to be accessed by each command before the command can be analysed according to the execution sequence of the plurality of parsed commands, and a transition is made if the foregoing condition for transitioning to CMD_ACT is satisfied.

2. cmd_acc: a condition for transitioning to CMD_ACC is particularly as follows:

It holds true for a current command, that is, a succeeding command can not be transitioned to a read/write state until the current command is completed.

3. cmd_pre: a condition for transitioning to CMD_PRE is particularly as follows:

(1) A succeeding command is to access a bank same as that to be accessed by the first command and a row different from that to be accessed by the first command, and to access the bank different from that to be accessed by a preceding command other than the first command, and then a PRE-CHARGE command will be transmitted after the first read/write command is completed; or (2) If some bank and row have been activated and none of the commands to be parsed refers to the bank, then a PRECHARGE command will be transmitted while the commands are parsed.

In an embodiment of the invention, the plurality of parsed commands can be denoted sequentially by Arabic numerals as a first command, a second command, . . . , the N-th command in an order that they are executed, where N represents the number of concurrently parsed commands.

In an embodiment of the invention, a command to be parsed is a command which has been received but has not been parsed.

4. cmd_bst: a condition for transitioning to CMD_BST is particularly as follows:

When data to be read by a command is not sufficient for a burst length of a DDR device, a BURST_TERMINATION command will be transmitted to block the exceeding data.

In an embodiment of the invention, the burst length can be a 4-word burst or a 8-word burst.

5. cmd_idle_exe: a condition for transitioning to CMD_IDLE is particularly as follows:

When no read or write command is transmitted to an external DDR device for a long period of time or there is a mode configuration or refresh command to be transmitted to the DDR device, the controller will be transitioned to a CMD_PRE_ALL state disabling all banks of the DDR device and then returned to a CMD_IDLE state.

6. A condition for transitioning to CMD_ACC_TM is as follows:

When an interval of time between a command to be executed and a previously transmitted command does not satisfy a time parameter requirement of the DDR device, a transition is made to a wait state.

In an embodiment of the invention, a transition is made to a corresponding state when the interval of time between the command to be executed and the previously transmitted command satisfies time parameter requirement of the DDR device.

In an embodiment of the invention, reference can be made to the description in the step 502 for the time parameters to be satisfied by the DDR device.

In the embodiments of the invention, a state machine prejudges relationships between a bank and a row of an address to be accessed by each parsed command and a bank and a row of an address for a currently executed command, and transmits PRECHARGE and ACTIVE in advance to thereby make full use of the bandwidth of a DDR device on one hand and make a parsing process more clear and methodical to make the execution process stable and reliable on the other hand.

Fourth Embodiment

Figure 9:
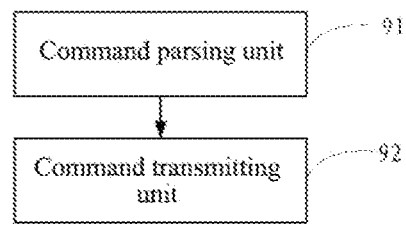
FIG. 9 is a structural diagram of a DDR controller according to a fourth embodiment of the invention.

FIG. 9 illustrates a structural diagram of a DDR controller according to a fourth embodiment of the invention. For the sake of a convenient description, only those parts relevant to the embodiment of the invention have been illustrated, and the DDR controller can be a unit in software, a unit in hardware or a combination thereof residing in a chip, but the invention will not be limited thereto.

In the embodiment of the invention, the system includes a command parsing unit 91 and a command transmitting unit 92, where:

The command parsing unit 91 parses a plurality of buffered commands concurrently.

In an embodiment of the invention, a DDR device may receive a plurality of commands from a plurality of devices, so the DDR device will buffer the plurality of commands and parse the plurality of buffered commands concurrently.

In an embodiment of the invention, the number of concurrently parsed commands is determined by the number of banks of the DDR device and the number of hosts accessing the DDR device in a system application, for example, the number of concurrently parsed commands can be 3, 4 or 8.

The command transmitting unit 92 prejudges relationships between a bank and a row of an address to be accessed by each command parsed by the command parsing unit 91 and a bank and a row of an address for a currently executed command, and transmits PRECHARGE and ACTIVE in advance.

In an embodiment of the invention, while the PRECHARGE command and the ACTIVE command are transmitted in advance according to a state machine, the PRECHARGE command and the ACTIVE command transmitted in advance shall also satisfy time parameters of the DDR device, for example, tRP (an interval of time between PRECHARGE and ACTIVE), tRRD (an interval of time between two ACTIVEs), tRCD (an interval of time between ACTIVE and a read or write command), etc.

In an embodiment of the invention, the number of buffered commands to be parsed concurrently is determined by the number of banks of the DDR device and the number of all hosts accessing the DDR device in a system application.

In the embodiments of the invention, PRECHARGE and ACTIVE command which should have been transmitted serially can be transmitted in parallel in advance to thereby improve effectively the utilization ratio of a bandwidth.

Fifth Embodiment

In an embodiment of the invention, the command transmitting unit 92 transmits PRECHARGE and ACTIVE in advance under the following conditions:

An ACTIVE command is transmitted in advance under the following condition:

A bank and a row to be accessed by a first command have not been activated; or

A bank and a row to be accessed by a succeeding command are different from a bank and a row to be accessed by any and all commands before the succeeding command;

A PRECHARGE command is transmitted in advance under the following condition:

A succeeding command is to access a bank same as that to be accessed by a first command and a row different from that to be accessed by a first command, and to access the bank different from that to be accessed by a preceding command other than the first command, and then a PRECHARGE command will be transmitted after the first read/write command is completed.

Sixth Embodiment

In an embodiment of the invention, the command transmitting unit 92 prejudges relationships between a bank and a row of an address to be accessed by each parsed command and a bank and a row of an address for a currently executed command, and transmits PRECHARGE and ACTIVE in advance. Reference can be made to the description of the state machine in the third embodiment for states and state transition conditions of the state machine.

In summary, advantageous effects of the embodiments of the invention are as follows:

1. A plurality of buffered commands are parsed concurrently, relationships are prejudged between a bank and a row of an address to be accessed by each parsed command and a bank and a row of an address for a currently executed command, and a PRECHARGE command and an ACTIVE command are transmitted in advance so that the PRECHARGE command and the ACTIVE command which should have been transmitted serially can be transmitted in advance by being hidden in parallel in a READ or WRITE cycle to thereby make full use of the bandwidth of a DDR device.

2. A state machine prejudges relationships between a bank and a row of an address to be accessed by each parsed command and a bank and a row of an address for a currently executed command, and transmits PRECHARGE and ACTIVE in advance to thereby make full use of the bandwidth of a DDR device on one hand and also make the method more stable and reliable on the other hand.

It shall be noted that in the foregoing embodiments of the system, the system is merely divided functionally and logically into the respective units included therein but will not be limited thereto so long as the corresponding functions can be performed; and furthermore the respective functional units are also particularly denominated only for the purpose of convenient distinguishing between them but not to limit the claimed scope of the invention.

Furthermore those ordinarily skilled in the art can appreciate that all or a part of the steps in the method according to the foregoing respective embodiments can be performed by program instructing relevant hardware, where the corresponding program can be stored in a computer readable storage medium, e.g., an ROM/RAM, a magnetic disk, an optical disk, etc.

The foregoing description is merely intended to illustrate the preferred embodiments of the invention but not to limit the invention, and any modifications, equivalent substitutions and improvements made without departing from the spirit and principle of the invention shall be encompassed in the claimed scope of the invention.

The invention claimed is:

1. A method of implementing a DDR controller, comprising;
   parsing N buffered read/write commands concurrently, wherein N is a positive integer and N is greater than or equal to 2; and
   prejudging relationships between a bank and a row of an address to be accessed by a first read/write command and a bank and a row of an address to be accessed by each read/write command other than the first read/write command in the N buffered read/write commands, and transmitting a PRECHARGE command and an ACTIVE command;
   wherein the ACTIVE command is transmitted as follows:
   when a bank to be accessed by a M-th read/write command is different from banks to be accessed by all read/write commands before the M-th read/write command in the N buffered read/write commands, the ACTIVE command is transmitted after the first read/write command is completed, wherein M is greater than 1, but less than or equal to N; or
   when a bank and a row to be accessed by the first read/write command have not been activated, the ACTIVE command is transmitted before executing the first read/write command; and
   the PRECHARGE command is transmitted as follows;
   when a bank to be accessed by the M-th read/write command is the same as a bank accessed by the first read/write command in the N buffered read/write commands, a row to be accessed by the M-th read/write command is different from a row accessed by the first read/write command in the N buffered read/write commands, and a bank to be accessed by the M-th read/write command is different banks to be accessed by all read/write commands other than the first read/write command before the M-th read/write command in the N buffered read/rite commands, then the PRECHARGE command is transmitted after the first read write command is completed.

2. The method according to claim 1, wherein a state machine prejudges the relationships between the bank and the row of the address to be accessed by the first read/write command and the bank and row of the address to be accessed by each parsed read/write command other than the first read/write command in the N buffered read/write commands.

3. The method according to claim 2, wherein states of the state machine comprise:
   an idle state in which there is no action but waiting for a command; an active state in which the ACTIVE command is transmitted; a read or write state in which a read/write command is transmitted; a disabled state in which the PRECHARGE command is transmitted; a burst termination state in which a BURST_TERMINATE command is transmitted; a wait state in which no command is transmitted; and an all-disabled state in which a PRECHARGE_ALL command is transmitted to ensure all banks of a DDR device are disabled after all commands are executed; and
   transition conditions of the states comprise:
   A. a condition for transitioning from the idle state, the read or write state, the wait state, the burst termination state, or the disabled state to the active state is as follows:
   a bank and a row to be accessed by the first read/write command have not been activated; or
   a bank to be accessed by the M-th read/write command is different from banks to be accessed by all read/write commands before the M-th read/write command in the N buffered read/write commands;
   B. a condition for transitioning from the active state, the wait state, the burst termination state, or the disabled state to the read or write state is as follows:
   after a currently executed read/write command is completed, the active state, the wait state, the burst termination state, or the disabled state is transitioned to the read or write state;
   C. a condition for transitioning from the active state, the read or write state, the wait state, or the burst termination state to the disabled state is as follows:
   when a bank to be accessed by the M-th read/write command is the same as a bank accessed by the first read/write command in the N buffered read/write commands, a row to be accessed by the M-th read/write command is different from a row accessed by the first read/write command in the N buffered read/write commands, and a bank to be accessed by the M-th read/write command is different banks to be accessed by all read/write commands other than the first read/write command before the M-th read/write command in the N buffered read/write commands, then the PRE-CHARGE is transmitted after the first read/write command is completed; or when a bank and a row have been activated and none of the N buffered read/write commands parsed refers to the bank, then the PRECHARGE command is transmitted while the N buffered read/write commands are executed;

D. a condition for transitioning from the active state, the read or write state, the wait state, or the disabled state to the burst termination state is as follows:

when data to be read by a read/write command is not sufficient for a burst length of a DDR device, a BURST_ TERMINATE command is transmitted;

E. a condition for transitioning from the wait state to the all-disabled state is as follows:

when no read or write command is transmitted to the DDR device for a first period of time, which is larger than a time threshold, or there is a mode configuration or refresh command to be transmitted to the DDR device, the wait state is transitioned to the all-disabled state to disable all banks of the DDR device;

F. a condition for transitioning from the all-disabled state to the idle state is as follows:

the all-disabled state is transitioned to the idle state after all banks of the DDR device are disabled; and G. a condition for transitioning from the active state, the read or write state, the burst termination state or the disabled state to the wait state is as follows:

when an interval of time between a command to be executed and a previously transmitted command does not satisfy a time parameter requirement of the DDR device, a transition is made to the wait state.

4. The method according to claim 1, wherein the number of buffered commands to be parsed concurrently is determined by the number of banks of a DDR device and the number of all hosts accessing the DDR device in a system application.

5. A DDR controller, the controller comprising:
a command parsing unit configured to parse N buffered commands concurrently, wherein N is a positive integer and N is greater than or equal to 2; and
a command transmitting unit configured to prejudge relationships between a bank and a row of an address to be accessed by a first read/write command and a bank and a row of an address to be accessed by each parsed read/write command other than the first read/write command in the N buffered read/write commands, and to transmit a PRECHARGE command and an ACTIVE command;

the command transmitting unit transmits the ACTIVE command under the following condition:

when a bank to be accessed by a M-th read/write command is different from banks to be accessed by all read/write commands before the M-th read/write command in the N buffered read/write commands, the ACTIVE command is transmitted after the first read/write command is completed, wherein M is greater than 1, but less than or equal to N; or when a bank and a row to be accessed by the first read/write command have not been activated, the ACTIVE command is transmitted before executing the first read/write command; and the PRECHARGE command is transmitted under the following condition:

when a bank to be accessed by the M-th read/write command is the same as a bank accessed by the first read/write command in the N buffered read/write commands, a row to be accessed by the M-th read/write command is different from a row accessed by the first read/write command in the N buffered read/write commands, and a bank to be accessed by the M-th read/write command is different from banks to be accessed by all read/write commands other than the first read/write command before the M-th read/write command in the N buffered read/write commands, then the PRECHARGE command is transmitted after the first read/write command is completed.

6. The controller according to claim 5, wherein the command transmitting unit uses a state machine to prejudge the relationships between the bank and the row of the address to be accessed by the first read/write command and the bank and row of the address to be accessed by each parsed read/write command other than the first read/write command in the N buffered read/write commands.

7. The controller according to claim 6, wherein states of the state machine comprise:

an idle state in which there is no action but waiting for a command; an active state in which the ACTIVE command is transmitted; a read or write state in which a read/write command is transmitted; a disabled state in which the PRECHARGE command is transmitted; a burst termination state in which a BURST_TERMINATE command is transmitted; a wait state in which no command is transmitted; and an all-disabled state in which a PRECHARGE_ALL command is transmitted to ensure all banks of a DDR device are disabled after all commands are executed; and transition conditions of the states comprise:

A. a condition for transitioning from the idle state, the read or write state, the wait state, the burst termination state, or the disabled state to the active state is as follows:

a bank and a row to be accessed by the first read/write command have not been activated; or a bank to be accessed by the M-th read/write command is different from banks to be accessed by all read/write commands before the M-th read/write command in the N buffered read/write commands;

B. a condition for transitioning from the active state, the wait state, the burst termination state, or the disabled state to the read or write state is as follows:

after a currently read/write command is completed, the active state, the wait state, the burst termination state, or the disabled state is transitioned to the read or write state;

C. a condition for transitioning from the active state, the read or write state, the wait state, or the burst termination state to the disabled state is as follows:

when a bank to be accessed by the M-th read/write command is the same as a bank accessed by the first read/write command in the N buffered read/write commands, a row to be accessed by the M-th read/write command is different from a row accessed by the first read/write command in the N buffered read/write commands, and a bank to be accessed by the M-th read/write command is different from banks to be accessed by all read/write commands other than the first read/write command before the M-th command in the N buffered read/write commands, then the PRECHARGE is transmitted after the first read/write command is completed; or when a bank and a row have been activated and none of the N buffered read/write commands parsed refers to the bank, then the PRECHARGE command is transmitted while the N buffered commands are executed;

D. a condition for transitioning from the active state, the read or write state, the wait state, or the disabled state to the burst termination state is as follows:

when data to be read by a read/write command is not sufficient for a burst length of a DDR device, a BURST_ TERMINATE command is transmitted;

E. a condition for transitioning from the wait state to the all-disabled state to the idle state is as follows:

when no read or write command is transmitted to the DDR device for a first period of time, which is larger than a time threshold, or there is a mode configuration or refresh command to be transmitted to the DDR device, the wait state is transitioned to the all-disabled state to disable all banks of the DDR device;

F. a condition for transitioning from the all-disabled state to the idle state is as follows:

the all-disabled state is transitioned to the idle state after all banks of the DDR device are disabled, and G. a condition for transitioning from the active state, the read or write state, the burst termination state or the disabled state to the wait state is as follows:

when an interval of time between a command to be executed and a previously transmitted command does not satisfy a time parameter requirement of the DDR device, a transition is made to the wait state.

8. The controller according to claim 5, wherein the number of buffered commands concurrently parsed by the command parsing unit is determined by the number of banks of a DDR device and the number of all hosts accessing the DDR device in a system application.

9. A chip, the chip comprising the DDR controller according to claim 5.

* * * * *